(12) United States Patent
Wang et al.

(10) Patent No.: US 7,304,501 B2
(45) Date of Patent: *Dec. 4, 2007

(54) METHOD AND APPARATUS FOR PROTECTING A CIRCUIT DURING A HOT SOCKET CONDITION

(75) Inventors: Xiaobao Wang, Cupertino, CA (US);
Khai Q. Nguyen, San Jose, CA (US);
Chiakang Sung, Milpitas, CA (US);
Bonnie I. Wang, Cupertino, CA (US)

(73) Assignee: Altera Corporation, San Jose, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 11/251,099

(22) Filed: Oct. 14, 2005

(65) Prior Publication Data

US 2007/0115028 A1    May 24, 2007

Related U.S. Application Data

(63) Continuation of application No. 10/635,625, filed on Aug. 5, 2003, now Pat. No. 6,972,593.

(51) Int. Cl.
*H03K 19/00* (2006.01)
*H03K 19/08* (2006.01)

(52) U.S. Cl. .............................. 326/56; 326/82; 326/83

(58) Field of Classification Search ............ 326/56–58, 326/82–83
See application file for complete search history.

(56) References Cited

U.S. PATENT DOCUMENTS

| | | | |
|---|---|---|---|
| 6,040,712 A | 3/2000 | Mejia | |
| 6,154,845 A | 11/2000 | Ilkbahar et al. | |
| 6,549,032 B1 | 4/2003 | Shumarayev et al. | |
| 6,630,844 B1 | 10/2003 | Chong et al. | |
| 6,810,458 B1 | 10/2004 | Bazargan et al. | |
| 6,972,593 B1 * | 12/2005 | Wang et al. ................... | 326/56 |

* cited by examiner

*Primary Examiner*—Anh Q. Tran
(74) *Attorney, Agent, or Firm*—G. Victor Treyz

(57) ABSTRACT

The hot socket detect circuit of the present invention includes a well bias circuit and three hot socket detect blocks. If the output of any of the three hot socket detect blocks is a digital high signal then the output of the hot socket detect circuit is a digital high signal. The digital high signal indicates that a hot socket condition exists.

19 Claims, 7 Drawing Sheets

METHOD AND APPARATUS FOR PROTECTING A CIRCUIT DURING A HOT SOCKET CONDITION

This application is a continuation of application Ser. No. 10/635,625, filed Aug. 5, 2003, now U.S. Pat. No. 6,972,593.

BACKGROUND OF THE INVENTION

This invention relates generally to integrated circuits. More particularly, this invention relates to a dynamic hot socket protection circuit for use in mixed-voltage systems.

Digital systems are commonly embedded on printed circuit boards. Different integrated circuits positioned on a printed circuit board may operate at different voltages. For example, with improvements in process technology, integrated circuits use lower power supply voltages, such as 3.3 Volts, 2.5 Volts, 1.8 Volts, or even lower. Integrated circuits made with these processes should remain compatible with previous generations of integrated circuits.

For example, a new generation 3.3 Volt integrated circuit may need to be used on a printed circuit board with an old generation 5 Volt integrated circuit. Systems of this type are commonly referred to as mixed-voltage systems. The 3.3 Volt integrated circuit will need to have the proper supply and input voltages for operation. In addition, the 3.3 Volt integrated circuit should supply or generate the proper output voltages for interfacing with the other integrated circuits.

Proper interfacing of the integrated circuits is essential for proper functional operation. Further, proper interfacing will prevent undesirable conditions, such as overstressing the devices, avoiding possible high current or latch-up conditions, and other similar concerns, thereby improving device longevity.

Many circuit architectures in mixed-voltage systems rely upon separate noisy and quiet supply voltage schemes. For example, an I/O driver may be coupled to a noisy supply while the on-chip conversion circuitry is coupled to the quiet supply. By separating the power supplies in this fashion, the circuitry connected to the quiet power supply is isolated somewhat from switching and other types of noise present on the noisy power supply.

Sometimes it is necessary to remove a circuit from a mixed-voltage system without shutting off the power within the system. This situation is referred to as a "hot socket" insertion. This situation arises frequently in systems that must be up 24 hours a day, 7 days a week. If not properly designed, a chip can interfere with the rest of the system during a hot socket insertion. Problems arise because as the chip is inserted, a race condition exists between the power pins and the input/output pins. If system signals reach the chip input/outputs before the system power reaches the chip's power pins (commonly referred to as a "hot socket condition"), the input/outputs may behave erratically, thereby causing a disturbance to the system. The disturbance can range from an inconsequential glitch to one that disables the system.

In view of the foregoing, it would be highly desirable to provide a mechanism to identify a hot socket condition, and thereafter isolate the output pins of the affected circuit until the hot socket condition is completed.

SUMMARY OF THE INVENTION

The method and apparatus of the present invention isolates the output pad of an integrated circuit during a hot socket condition.

A circuit of the present invention includes an output node having an output voltage, a set of transistors that control the signal level on the output node. The circuit further includes a quiet voltage supply providing a quiet voltage, a noisy voltage supply providing a noisy voltage and a pre-driver voltage supply. The pre-driver voltage supply is used to power the pre-drivers that control the set of transistors. Preferably, the pre-driver voltage has a higher value than either the quiet voltage or the noisy voltage.

The circuit further includes a hot socket detect circuit to identify when the quiet, noisy or pre-driver voltage supply is below a predetermined value indicative of a hot socket condition. The hot socket detect circuit includes a well bias circuit and three hot socket detect blocks. If the output of any of the three hot socket detect blocks is a digital high signal then the output of the hot socket detect circuit is a digital high signal. The digital high signal indicates that a hot socket condition exists.

The method of the implementation includes controlling an integrated circuit output signal during a hot socket condition where the integrated circuit includes first, second and third input voltage signals. The third input voltage signal is greater than either the first or the second input voltage signal. The integrated circuit further has an output voltage at an output pad of the integrated circuit.

The method may further include determining a VWELL voltage, the VWELL voltage being the highest of the output voltage, the first voltage, and the third voltage. Next, determining a HOT1 signal using the VWELL voltage and the third voltage. And determining a HOT2 signal using second and third voltages. And determining a HOT3 signal using the first and third voltages. A hot socket condition is indicated if either the HOT1 or the HOT2 or the HOT3 signal is a digital high signal.

BRIEF DESCRIPTION OF THE DRAWINGS

The above and other advantages of the invention will be apparent upon consideration of the following detailed description, taken in conjunction with the accompanying drawings, in which like reference characters refer to like parts throughout, and in which.

DETAILED DESCRIPTION OF THE INVENTION

The circuit of the present invention turns off the output buffer during a hot socket condition. The circuit includes a hot socket detect circuit that detects a hot socket condition and sends out a signal indicating a hot socket condition. The hot socket detect circuit includes a well bias circuit and three hot socket detect blocks. If the output of any one of the three hot socket detect blocks is a digital high signal then the output of the hot socket detect circuit is a digital high signal. The digital high signal indicates that a hot socket condition exists.

Figure 1:
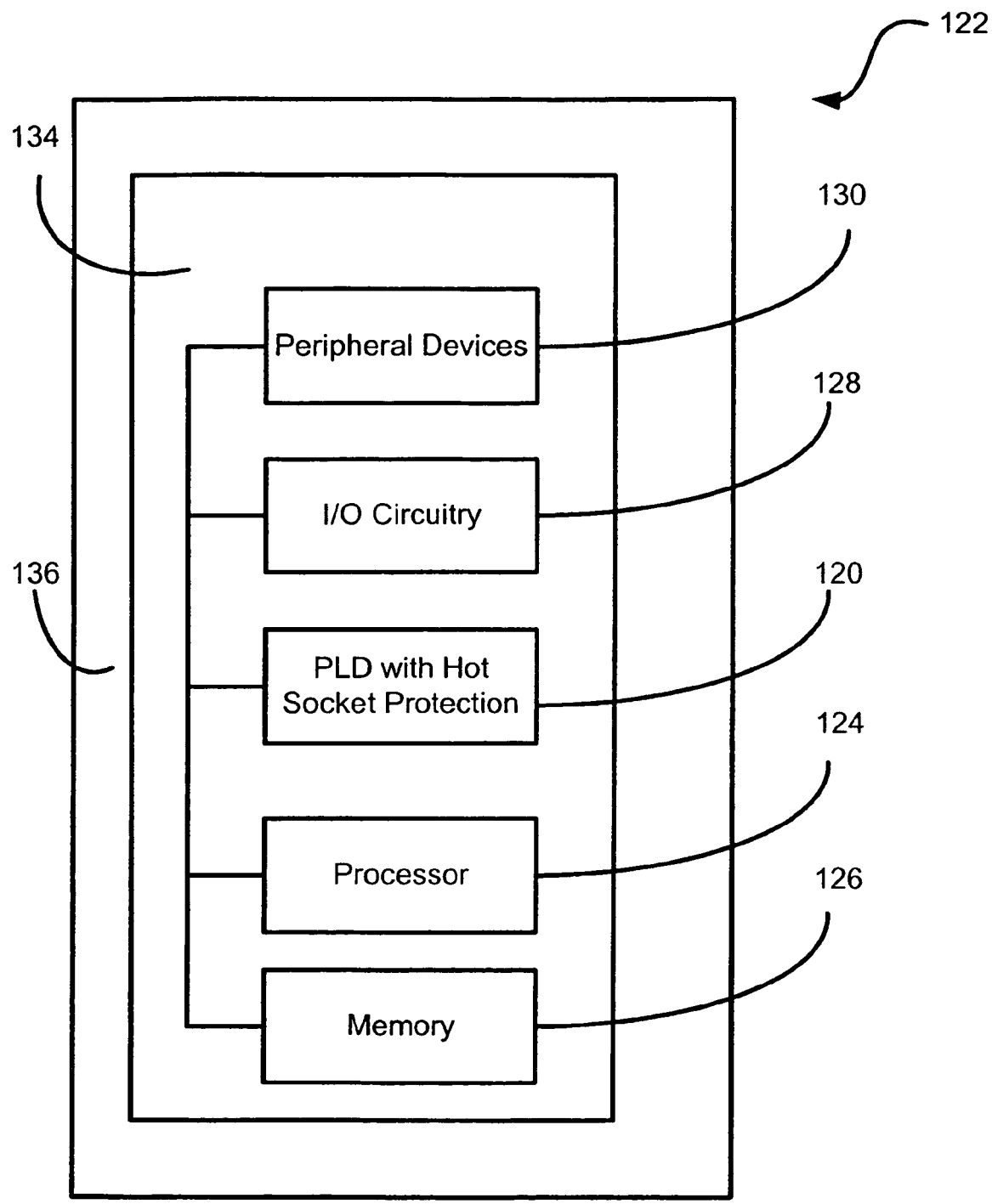
FIG. 1 illustrates a programmable logic device that incorporates an output buffer in accordance with the invention.

FIG. 1 illustrates a programmable logic device (PLD) 120 incorporating an output buffer in accordance with the invention. PLDs are integrated circuits that provide the advantages of fixed integrated circuits with the flexibility of custom integrated circuits. Such devices are currently represented by, for example, Altera's Stratix and Stratix GX series of PLDs. The present invention may be used with PLDs such as PALs, PLAs, FPLAs, CPLDs, EPLDs, EEPLDs, LCAs, or FPGAs. Additionally, the present invention may also be used in other types of integrated circuits that need hot socket protection such as ASICS, ASSPs and the like.

The PLD 120 forms part of a data processing system 122. The data processing system 122 may include one or more of the following components: a processor 124, a memory 126, input/output circuitry 128, and peripheral devices 130. These components are coupled together by a system bus 132 and are populated on a circuit board 134, which is contained in an end-user system 136.

The system 122 can be used in a wide variety of applications, such as computer networking, data networking, instrumentation, video processing, digital signal processing, or any other application where the advantage of using re-programmable logic is desirable. The PLD 120 can be used to perform a variety of logic functions. For example, the PLD 120 can be configured as a processor or controller that works in cooperation with processor 124. In yet another example, the PLD 120 can be configured as an interface between the processor 124 and one of the other components in the system 122.

There are instances when the PLD 120 must be replaced while the remaining components in the system 122 remain operative, commonly referred to as a hot socket condition. The present invention is directed toward solving problems that arise during a hot socket condition.

During hot socket insertion of a PLD 120, a race condition is created between the power pins and the input/output pins of the PLD 120. If system signals reach the PLD input/output pins before the system power reaches the chip's power pins, the input/outputs may create disturbances in the remainder of the system 122. The present invention prevents this problem in PLDs and other integrated circuits that operate with mixed voltages.

Figure 2:
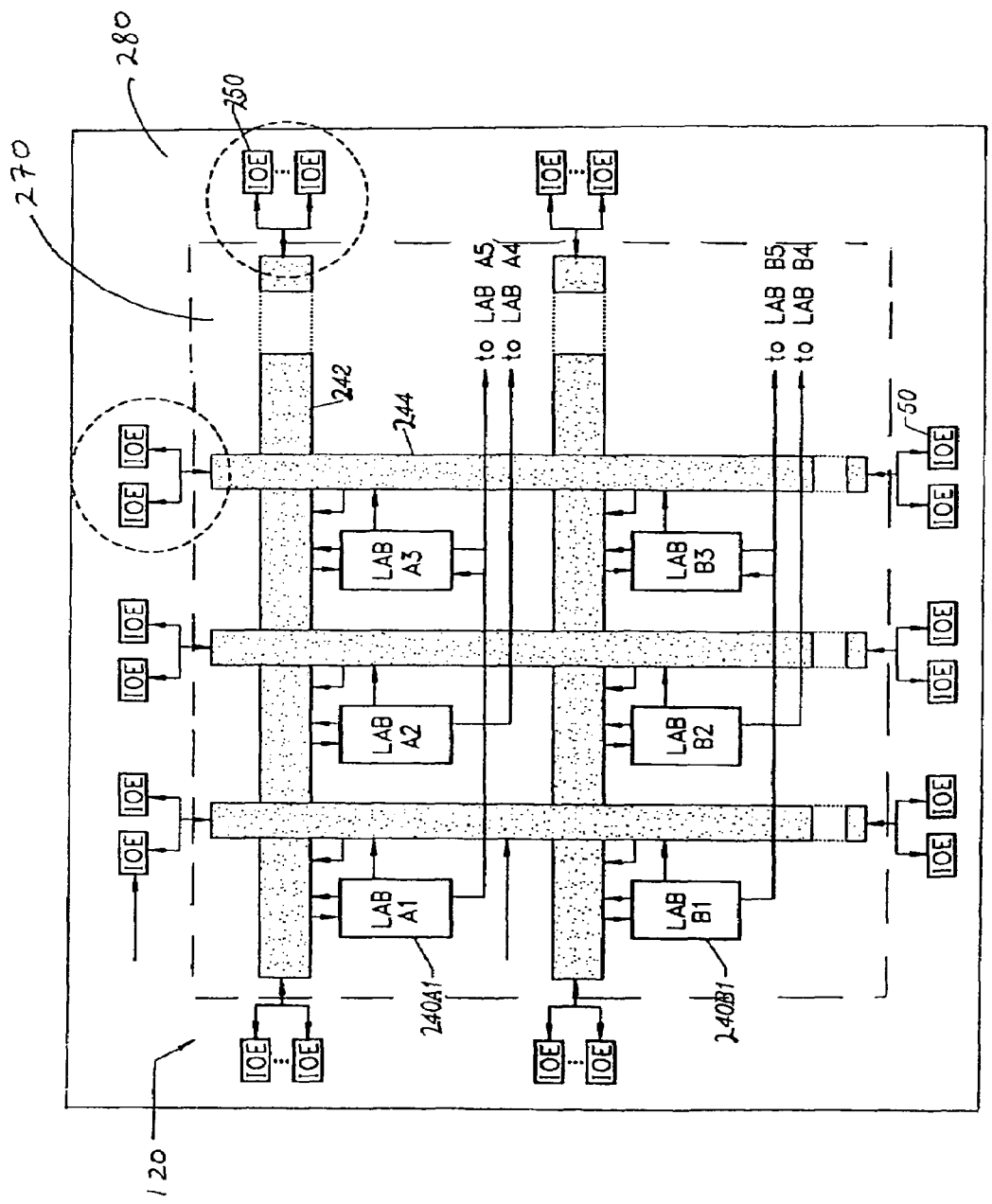
FIG. 2 illustrates a programmable logic device in accordance with the invention.

FIG. 2 illustrates a programmable logic device 120 in accordance with the invention. The programmable logic device 120 includes a set of logic array blocks 240. As known in the art, a logic array block 240 performs programmed logic operations. Row interconnect circuitry 242 and column interconnect circuitry 244 link the various logic array blocks 240. Row interconnect circuitry 242 and column interconnect circuitry 244 are well known in the art. The invention may be constructed using logic array blocks 240, row interconnect circuitry 242, and column interconnect circuitry 244 of the type used in the Stratix and Stratix GX families of PLDs sold by Altera Corporation, San Jose, Calif.

Input/output elements 250 are positioned at the ends of the row interconnect circuitry 242 and column interconnect circuitry 244. The input/output elements 250 are used for standard input/output functions. The input/output elements 250 include input buffers and output buffers. The input buffers may be implemented using prior art architectures. The output buffers are constructed in accordance with the invention. As described below, the output buffers are configured such that they are shut-off during a hot socket condition. Thus, the output buffers do not create erroneous signals that can affect system performance when a hot socket condition exists.

The output buffer of the invention is implemented in a semiconductor (chip) used in a mixed-voltage environment. That is, the output buffer of the invention relies upon a quiet or internal voltage supply (VCCQ), a noisy or input/output voltage supply (VCCN) and a pre-driver voltage supply (VCCPD). The circuit of the invention also relies upon a third voltage, VCCPD. The VCCQ is used to power the core 270 of the programmable logic device 120, the VCCN powers the periphery 280 of the PLD 120 and the VCCPD powers the pre-drivers of the output buffers of the PLD 120.

Figure 3:
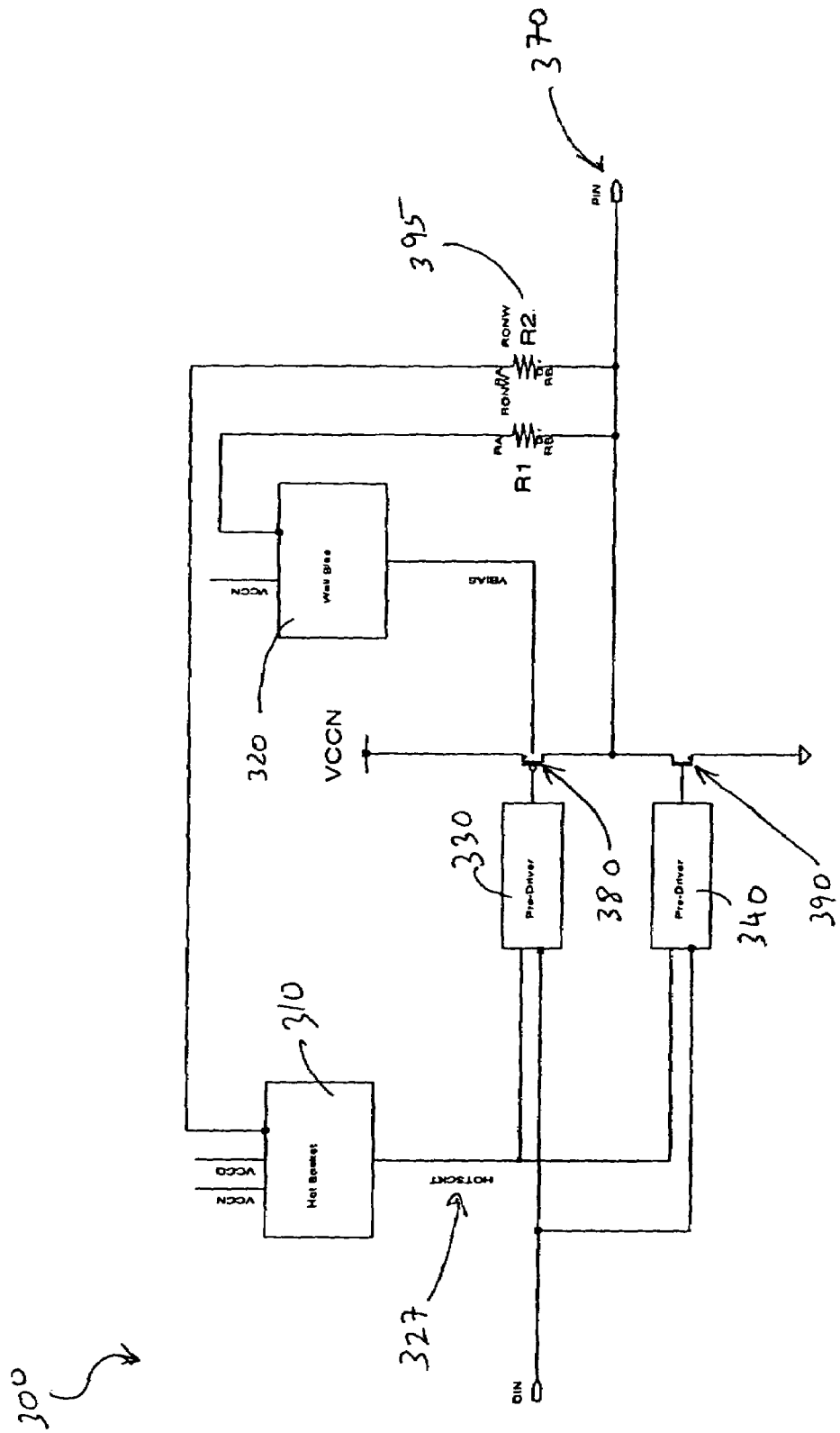
FIG. 3 illustrates an exemplary prior art output buffer.

FIG. 3 illustrates an exemplary prior art output buffer. The output buffer 300 is of the type used in, for example, the Stratix and Stratix GX families of PLDs sold by Altera Corporation. Output buffer 300 is configured such that the circuit 300 is shut-off during a hot socket condition.

Buffer 300 includes a hot socket detect circuit 310, a well bias circuit 320, and pre-drivers 330, 340. The hot socket detect circuit 310 receives three inputs VCCQ, VCCN, and PIN. PIN is the voltage at the IO pin 370. Based on these signals, the circuit 310 determines whether a hot socket condition exists.

Well bias circuit 320 pulls the voltage VBIAS to the higher of VCCN and PIN. VBIAS is used to minimize the leakage current between pin 370 and the PMOS transistor 380. The pre-drivers 330 and 340 control the gate signal at the PMOS and NMOS transistors, respectively and thereby can be used to override the signal from core logic at pin 370. The PMOS 380 and NMOS 390 transistors control the digital signal on the output pin 370 of the circuit 300.

The hot socket circuit 310 has three inputs: VCCN, VCCQ and PIN. PIN is the voltage at the IO pin 370. When both VCCN and VCCQ are high, the hot socket signal is low. Thereby, indicating that a hot socket condition does not exist and the PLD continues to perform its normal operations. If, however, VCCN and VCCQ are not both high then the hot socket signal is high, indicating that a hot socket condition exists and the output buffer 300 is shut-off in order to minimize interference with the other components in the system. During a hot socket condition, the voltage of the hot socket signal HOTSCKT 327 is the higher of VCCN and PIN.

When the voltage of the hot socket circuit is high, the pre-driver of the NMOS gate pulls the NMOS voltage to ground and the pre-driver of the PMOS gate pulls the voltage of the PMOS gate to the higher of VCCN and PIN. The PMOS sits in a floating well controlled by the well bias circuit, the well bias circuit pulls the bulk of the PMOS to the higher voltage of VCCN and PIN. Thereby, turning off both the PMOS and NMOS transistors.

Figure 4:
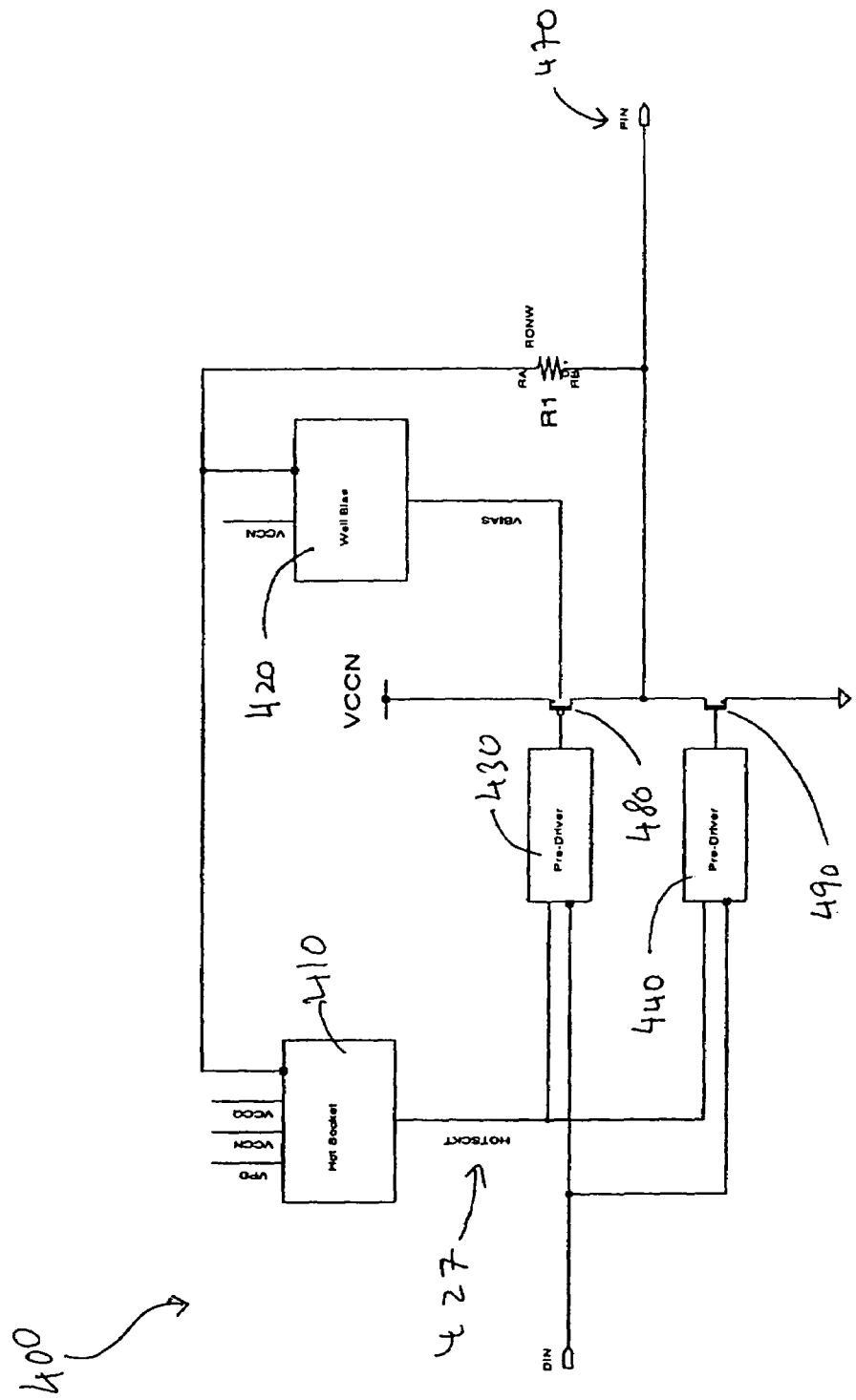
FIG. 4 illustrates a hot socket detect circuit in accordance with an embodiment of the invention.

FIG. 4 shows the block diagram of a hot socket circuit that uses the output buffer of the present invention. The PLD incorporating this buffer has three power sources: VCCN, VCCQ and VCCVD. In the hot socket circuit of FIG. 3, the pre-driver and the periphery circuitry were both powered by VCCN. Therefore, the acceptable values for VCCN are constrained by the voltage requirements at the various IO ports. Thus, the VCCN value may not be optimum for the PMOS and NMOS transistor operation.

By providing a separate voltage for the pre-drivers, this constraint is removed and an optimum voltage value for the pre-drivers can be selected, leading to higher speed and reduced die size. Introducing VCCPD and selecting the voltage of the VCCPD to be the same as that of the PMOS and NMOS transistors leads to a more efficient transistor operation, thereby increasing the speed of the device. Preferably, VCCPD is higher than or equal to VCCN or VCCQ (i.e. VCCPD=3.3 Volts, VCCQ=1.2-1.5 Volts and VCCN=1.5-3.3 Volts). Preferably, the VCCPD is 3.3 volts and the PMOS and NMOS transistors are designed for 3.3 volts.

Additionally, in the hot socket circuit of FIG. 3, there is a leakage current path from VWELL to VCCN. Therefore, a second ESD resistor 395 is needed to isolate the hot socket block 310 and the well bias circuit 320. However, by introducing a third voltage source and selecting the value of the third voltage source to be the highest values of all three voltage sources eliminates the need for the ESD transistor. Because the value of the third voltage source will always be greater than or equal to VWELL, thereby eliminating the leakage current.

Buffer 400 includes a hot socket detect circuit 410, a well bias circuit 420, and pre-drivers 430, 440. The hot socket detect circuit 410 receives four inputs VCCPD, VCCQ, VCCN, and PIN. PIN is the voltage at the IO pin 470. Based on these signals, the circuit 410 determines whether a hot socket condition exists. Well bias circuit 420 pulls the voltage VWELL to the highest of VCCN and PIN. The pre-drivers 430 and 440 control the gate signal at the PMOS and NMOS transistors and thereby can be used to override the signal from core logic or pin 470. The PMOS and NMOS transistors control the digital signal on the output pin 470 of the circuit 400.

When VCCPD, VCCN and VCCQ are high, the hot socket signal HOTSCKT 427 is low. Thereby indicating that a hot socket condition does not exist. If VCCPD, VCCN and VCCQ are not all high then the hot socket signal is high, indicating that a hot socket condition exists. During a hot socket condition, the voltage of the hot socket signal is the highest of VCCPD, VCCN and PIN.

When the voltage of the hot socket circuit is high, the pre-driver of the NMOS gate pulls the NMOS voltage to ground and the pre-driver of the PMOS gate pulls the voltage of the PMOS gate to the higher of VCCPD, VCCN and PIN. The PMOS sits in a floating well controlled by the well bias circuit, the well bias circuit pulls the bulk of the PMOS to the higher voltage of VCCN and PIN. Thereby turning off both the PMOS and NMOS transistors.

Figure 5:
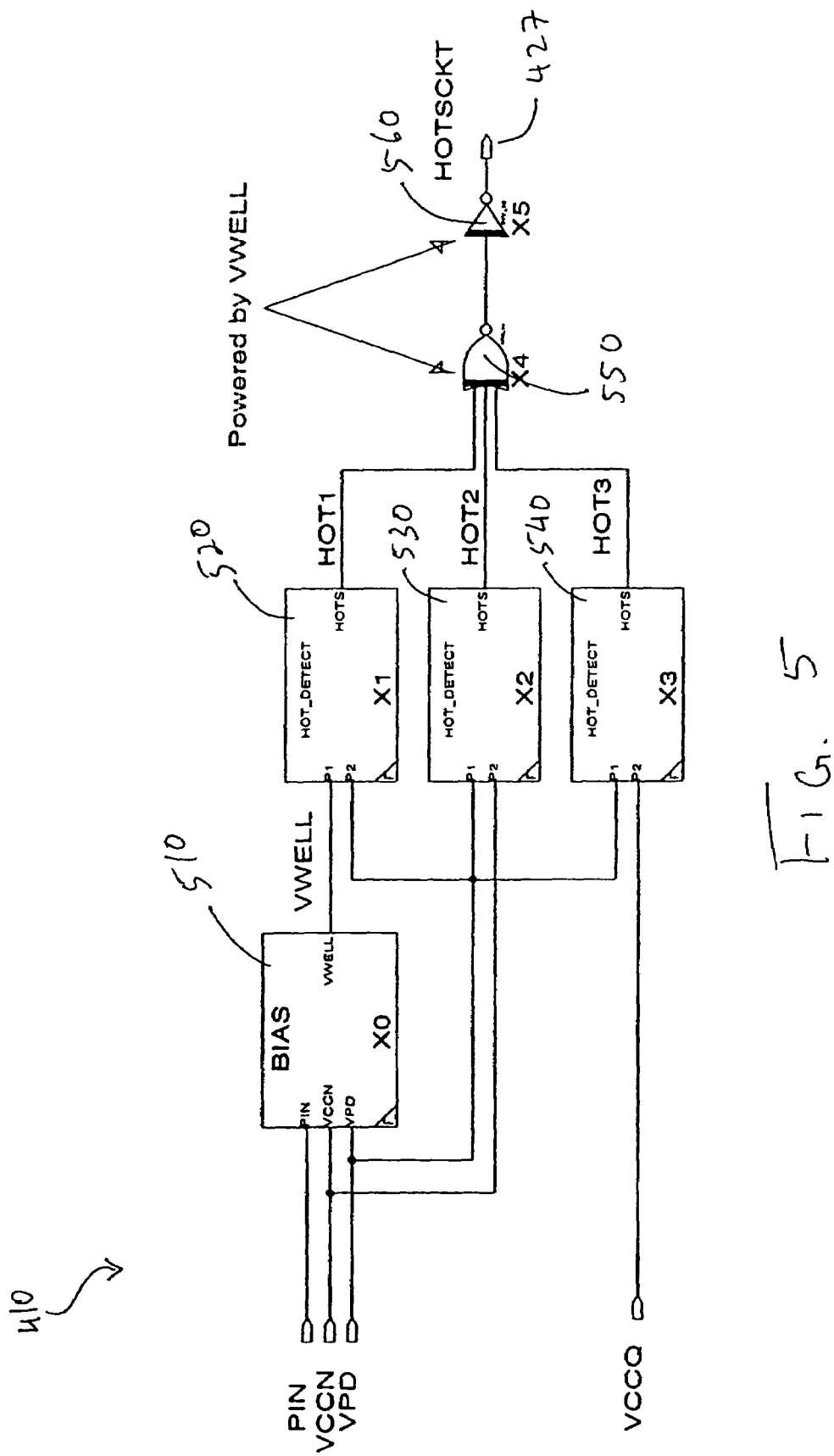
FIG. 5 illustrates a hot socket detect circuit in accordance with an embodiment of the invention.

FIG. 5 illustrates one possible implementation of a hot socket detect circuit 410 in accordance with an embodiment of the invention. The hot socket detect circuit 410 comprises a well bias circuit 510 and three hot socket detecting blocks 520, 530 and 540. The hot socket detect circuit 510 has four inputs: VCCPD, VCCN, VCCQ and PIN. The device is in hot socket condition when the output HOTSCKT 427 of the hot socket detect circuit 410 is high.

The well bias circuit 510 has three inputs: PIN, VCCN and VCCPD. The output of the well bias circuit 510 is the highest of the three inputs: PIN, VCCPD or VCCN. The well bias circuit 510 is described in greater detail below in connection with FIG. 6. Each of the three hot socket detect blocks, 520, 530, and 540, has two inputs P1 and P2 and an output HOTS. If P2 is low then HOTS is equal to P1. If P2 is high then HOTS is low. The outputs from each of the three hot socket detect blocks is input to an NOR gate 550. And the output of the NOR gate 550 is input to the inverter 560 which then outputs the final HOTSCKT signal 427. The hot socket blocks, 520, 530 and 540, are described in greater detail below in connection with FIG. 7. The NOR gate 550 and inverter 560 are powered by VWELL so that when any of the three pins: VCCN, VCCPD, or PIN is high, the NOR gate 550 and the inverter 560 have power.

Figure 6:
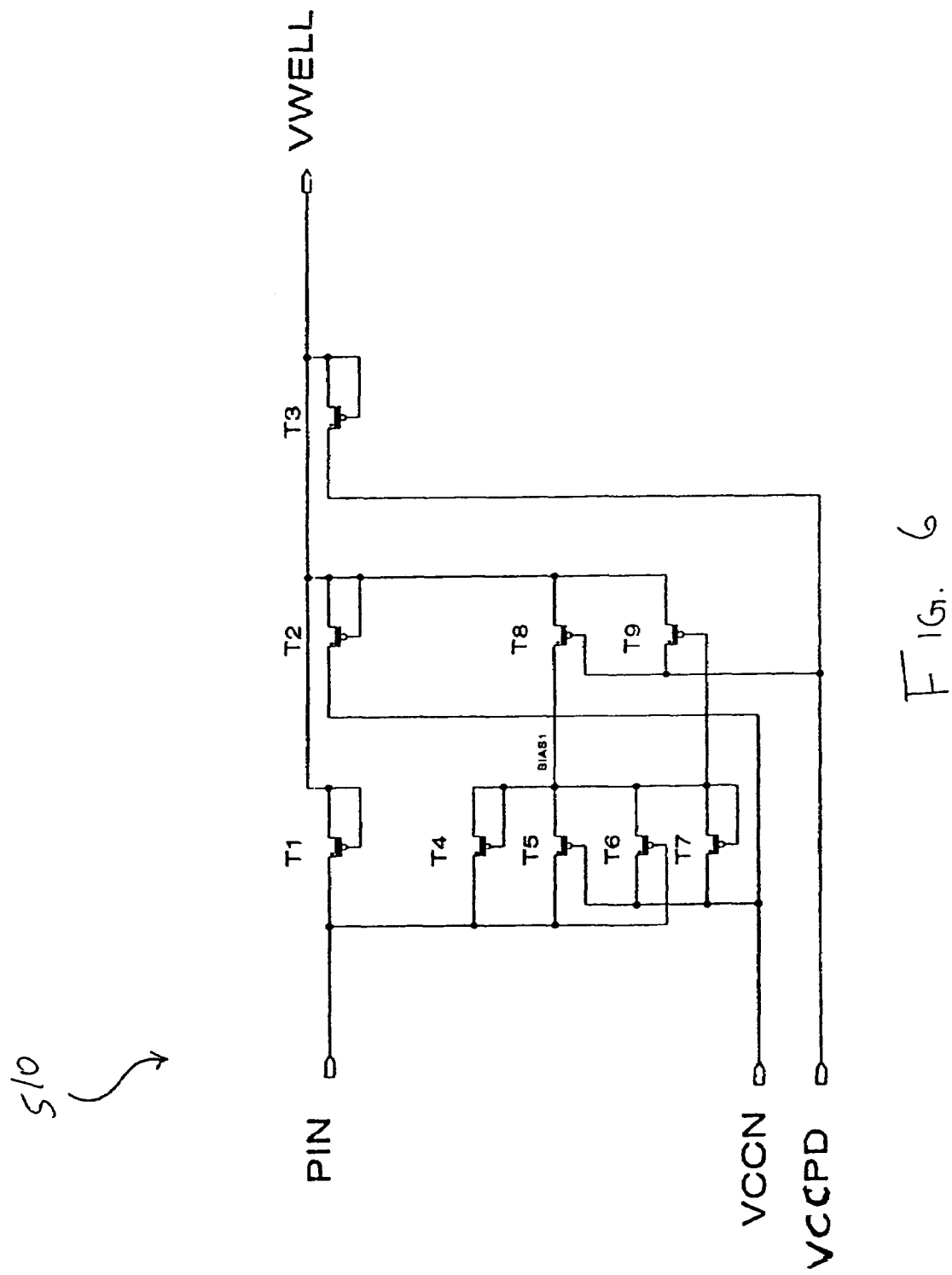
FIG. 6 shows an exemplary circuit implementation of a well bias block in accordance with an embodiment of the invention.

FIG. 6 shows an exemplary circuit implementation of a well bias block 510 in accordance with an embodiment of the invention. The well bias circuit 510 consists of 9 PMOS transistors T1-T9. Transistors T4-T9 pull VWELL to the highest level among VCCN, PIN and VCCPD. First transistors T4-T7 pull node BIAS 1 to the higher of VCCN and PIN voltages. Then transistors T8-T9 pull VWELL to the higher of the BIAS1 and VCCPD voltages. Thereby generating an output VWELL which is the highest of the VCCN, PIN and VCCPD voltages. In the case where VCC, VCCPD and PIN are equal to each other, the T1-T3 transistors pull VWELL to a predetermined voltage. Preferably, the T1-T3 transistors pull the VWELL voltage to VCCN-Vt where Vt is a transistor threshold voltage.

Figure 7:
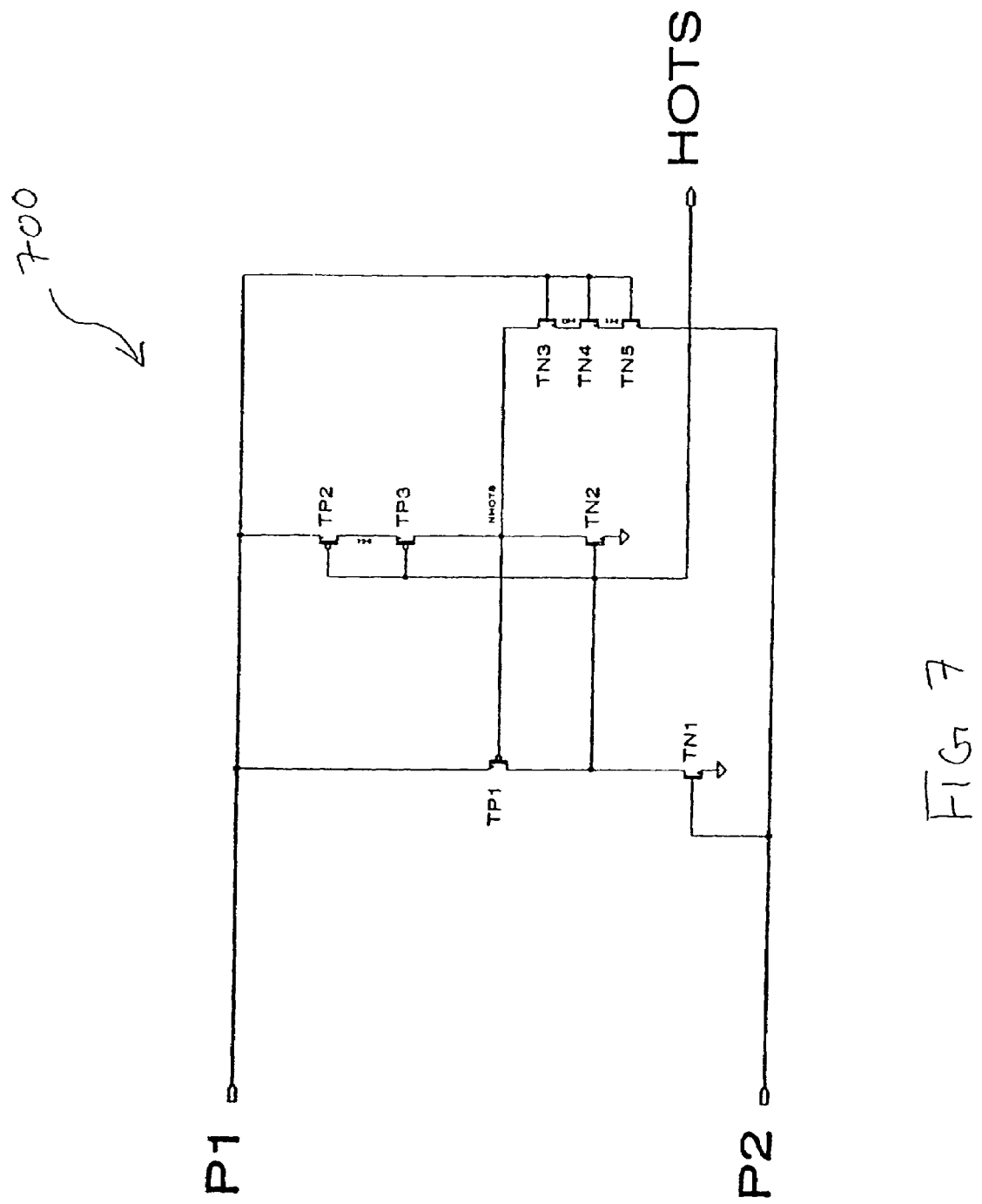
FIG. 7 shows an exemplary circuit implementation of a hot socket detect block in accordance with an embodiment of the invention.

FIG. 7 shows an exemplary circuit implementation of a hot socket detect block in accordance with an embodiment of the invention. The hot socket detect block 700 is any one of the hot sockets blocks 520, 530 and 540. Hot socket block 700 has two inputs P1 and P2 and an output HOTS. Transistors TP1-3 and TN2 form a latch.

When P2 is a digital low signal, the transistor TN1 is off. Transistors TN3-5 pulls NHOTS 710 to a digital low which results in a digital high signal at HOTS. When P2 is a digital high signal, the transistor TN1 is on and pulls HOTS to a digital low signal.

Because P1 and P2 may have different voltage levels, there may be leakage paths between P1 and P2. Preferably, the sizes of the TN3-5 and TP2-3 are designed to minimize this leakage current. Preferably, the sized of TN3-5 and TP2-3 are selected such that the IO pin leakage current is less than 10μ. Preferably TN3-5 are much larger than TP2-3, giving the circuit a fast response time during a hot socket condition. Thus, the hot socket signal can be turned on quickly.

Thus, the circuit of the invention identifies a hot socket condition, and thereafter isolates an output pad until the hot socket condition is completed. Consequently, the invention provides a convenient mechanism for supporting hot socket replacement of semiconductors on a printed circuit board. Advantageously, the circuit of the invention is readily implemented with a relatively few number of standard electronic components.

The foregoing description, for purposes of explanation, used specific nomenclature to provide a thorough understanding of the invention. However, it will be apparent to one skilled in the art that the specific details are not required in order to practice the invention. In other instances, well known circuits and devices are shown in block diagram form in order to avoid unnecessary distraction from the underlying invention.

Thus, the foregoing descriptions of specific embodiments of the present invention are presented for purposes of illustration and description. They are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

What is claimed is:

1. Circuitry on an integrated circuit, comprising:
   at least one input-output pin having an associated input-output pin voltage;
   a first line that receives a first power supply voltage;
   a second line that receives a second power supply voltage that is independent of the first power supply voltage;
   a third line that receives a third power supply voltage that is independent of the first and second power supply voltages; and
   a hot socket detect circuit that processes the input-output pin voltage, the first power supply voltage, the second power supply voltage, and the third power supply voltage and produces a corresponding hot socket detect signal indicative of whether the integrated circuit is in a hot socket condition.

2. The circuitry defined in claim 1 further comprising core logic powered with the first power supply voltage.

3. The circuitry defined in claim 1 further comprising predriver circuitry powered by the second power supply voltage.

4. The circuitry defined in claim 1 further comprising input-output circuitry, wherein at least some of the input-output circuitry is located around a peripheral region of the integrated circuit and is powered by the third power supply voltage.

5. The circuitry defined in claim 1 further comprising:
   core logic powered with the first power supply voltage; and
   predriver circuitry powered by the second power supply voltage.

6. The circuitry defined in claim 1 further comprising:
   core logic powered with the first power supply voltage; and
   input-output circuitry, wherein at least some of the input-output circuitry is located around a peripheral region of the integrated circuit and is powered by the third power supply voltage.

7. The circuitry defined in claim 1 further comprising:
   predriver circuitry powered by the second power supply voltage; and
   input-output circuitry, wherein at least some of the input-output circuitry is located around a peripheral region of the integrated circuit and is powered by the third power supply voltage.

8. The circuitry defined in claim 1 further comprising:
   core logic powered with the first power supply voltage;
   predriver circuitry powered by the second power supply voltage; and
   input-output circuitry, wherein at least some of the input-output circuitry is located around a peripheral region of the integrated circuit and is powered by the third power supply voltage.

9. The circuitry defined in claim 1 further comprising:
   core logic powered with the first power supply voltage;
   predriver circuitry powered by the second power supply voltage; and
   input-output circuitry, wherein at least some of the input-output circuitry is located around a peripheral region of the integrated circuit and is powered by the third power supply voltage, wherein the second power supply voltage is greater than or equal to the first power supply voltage.

10. The circuitry defined in claim 1 further comprising:
    core logic powered with the first power supply voltage;
    predriver circuitry powered by the second power supply voltage; and
    input-output circuitry, wherein at least some of the input-output circuitry is located around a peripheral region of the integrated circuit and is powered by the third power supply voltage, wherein the second power supply voltage is greater than or equal to the third power supply voltage.

11. The circuitry defined in claim 1 further comprising:
    core logic powered with the first power supply voltage;
    predriver circuitry powered by the second power supply voltage; and
    input-output circuitry, wherein at least some of the input-output circuitry is located around a peripheral region of the integrated circuit and is powered by the third power supply voltage, wherein the second power supply voltage is greater than or equal to the first power supply voltage and is greater to or equal to the third power supply voltage.

12. The circuitry defined in claim 1 further comprising predriver circuitry that is powered by the second power supply voltage and that is controlled by the hot socket detect signal.

13. The circuitry defined in claim 1 wherein the hot socket detect circuit comprises three hot socket detecting blocks and a well bias circuit, wherein the well bias circuit receives at least the second and third power supply voltages.

14. The circuitry defined in claim 1 wherein the hot socket detect circuit comprises:
    logic circuitry that supplies the hot socket detect signal; and
    three hot socket detecting blocks, each of which produces a corresponding output that is supplied to logic circuitry.

15. The circuitry defined in claim 1 wherein the hot socket detect circuit comprises:
    a NOR gate; and
    three hot socket detecting blocks, each of which produces a corresponding output that is supplied to NOR gate.

16. The circuitry defined in claim 1 wherein the input-output pin comprises an output pin.

17. An integrated circuit comprising:
    at least one input-output pin having an associated input-output pin voltage;
    core circuitry powered at a core power supply voltage;
    predriver circuitry powered at a predriver power supply voltage;
    input-output circuitry powered at an input-output power supply voltage; and
    a hot socket detect circuit that receives the core power supply voltage, the predriver power supply voltage, the input-output power supply voltage, and the pin voltage and that generates a hot socket detector signal in response that is indicative of whether the integrated circuit is in a hot socket condition.

18. A method for detecting a hot socket condition on an integrated circuit comprising:
    receiving an input-output pin voltage associated with an input-outpin pin on the integrated circuit using a hot socket detect circuit;

receiving a core power supply voltage with the hot socket detect circuit, wherein the core power supply voltage is used to power core logic on the integrated circuit;

receiving a predriver power supply voltage with the hot socket detect circuit, wherein the predriver power supply voltage is used to power predriver circuitry on the integrated circuit;

receiving an input-output power supply voltage with the hot socket detect circuit, wherein the input-output power supply voltage is used to power input-output circuitry located in a peripheral region of the integrated circuit; and producing a hot socket detect signal with the hot socket detect circuit in response to the received input-output pin voltage, the received core power supply voltage, the received predriver power supply voltage, and the received input-output power supply voltage, wherein the hot socket detect signal is indicative of whether the integrated circuit is in a hot socket condition.

19. The method defined in claim 18 wherein the integrated circuit comprises an output buffer in the input-output circuitry, the method further comprising:

when the hot socket detect signal has a first value, turning the output buffer on; and when the hot socket detect signal has a second value, turning the output buffer off.

* * * * *